(12) United States Patent
Gupta et al.

(10) Patent No.: US 12,137,553 B2
(45) Date of Patent: Nov. 5, 2024

(54) MEMORY ARRAY AND METHOD USED IN FORMING A MEMORY ARRAY

(71) Applicant: Micron Technology, Inc., Boise, ID (US)

(72) Inventors: Sidhartha Gupta, Boise, ID (US); Naveen Kaushik, Boise, ID (US); Pankaj Sharma, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 463 days.

(21) Appl. No.: 17/395,211

(22) Filed: Aug. 5, 2021

(65) Prior Publication Data

US 2023/0039621 A1 Feb. 9, 2023

(51) Int. Cl.
*H10B 41/27* (2023.01)
*H01L 23/538* (2006.01)
*H10B 43/27* (2023.01)

(52) U.S. Cl.
CPC .......... *H10B 41/27* (2023.02); *H01L 23/5384* (2013.01); *H10B 43/27* (2023.02)

(58) Field of Classification Search
CPC ...... H10B 41/27; H10B 43/27; H01L 23/5384
See application file for complete search history.

(56) References Cited

U.S. PATENT DOCUMENTS

| | | | |
|---|---|---|---|
| 10,256,247 | B1 | 4/2019 | Kanakamedala et al. |
| 10,607,996 | B1 | 3/2020 | Sasaki |
| 10,903,237 | B1 | 1/2021 | Hosoda et al. |
| 2005/0090096 | A1 | 4/2005 | Hou et al. |
| 2013/0187112 | A1 | 7/2013 | Kuniya |

(Continued)

FOREIGN PATENT DOCUMENTS

WO PCT/US2022/036454    2/2024

OTHER PUBLICATIONS

Mackus et al., "From the Bottom-Up: Toward Area-Selective Atomic Layer Deposition with High Selectivity", Chemistry of Materials vol. 31, 2019, United States, pp. 2-12.

(Continued)

*Primary Examiner* — Christine A Enad
(74) *Attorney, Agent, or Firm* — Wells St. John P.S.

(57) ABSTRACT

A method used in forming a memory array comprises forming a stack comprising vertically-alternating insulative tiers and conductive tiers. Channel-material strings of memory-cell strings extend through the insulative and conductive tiers. Conductive vias are formed above and individually electrically coupled to individual of the channel-material strings. Insulating material is laterally-between immediately-adjacent of the conductive vias. At least some of the insulating material is vertically removed to form an upwardly-open void-space that is circumferentially about multiple of the conductive vias. Insulative material is formed laterally-between the immediately-adjacent conductive vias to form a covered void-space from the upwardly-open void-space. Digitlines are formed above that are individually electrically coupled to a plurality of individual of the conductive vias there-below. Other embodiments, including structure independent of method, are disclosed.

29 Claims, 13 Drawing Sheets

(56) References Cited

U.S. PATENT DOCUMENTS

| | | | |
|---|---|---|---|
| 2016/0093635 A1* | 3/2016 | Rabkin | H01L 21/76877 257/314 |
| 2016/0155659 A1 | 6/2016 | Yang | |
| 2017/0330832 A1* | 11/2017 | He | H01L 27/1203 |
| 2019/0088672 A1 | 3/2019 | Tomimatsu | |
| 2019/0287994 A1 | 9/2019 | Tanaka et al. | |
| 2019/0333581 A1 | 10/2019 | Diep et al. | |
| 2020/0027892 A1 | 1/2020 | Zhu et al. | |
| 2020/0185407 A1 | 6/2020 | Xiao et al. | |
| 2021/0104539 A1 | 4/2021 | Lee | |
| 2021/0193585 A1 | 6/2021 | Said et al. | |
| 2021/0217694 A1 | 7/2021 | Jain et al. | |

OTHER PUBLICATIONS

U.S. Appl. No. 16/793,263; filed Feb. 18, 2020, by Vahdat et al.

* cited by examiner

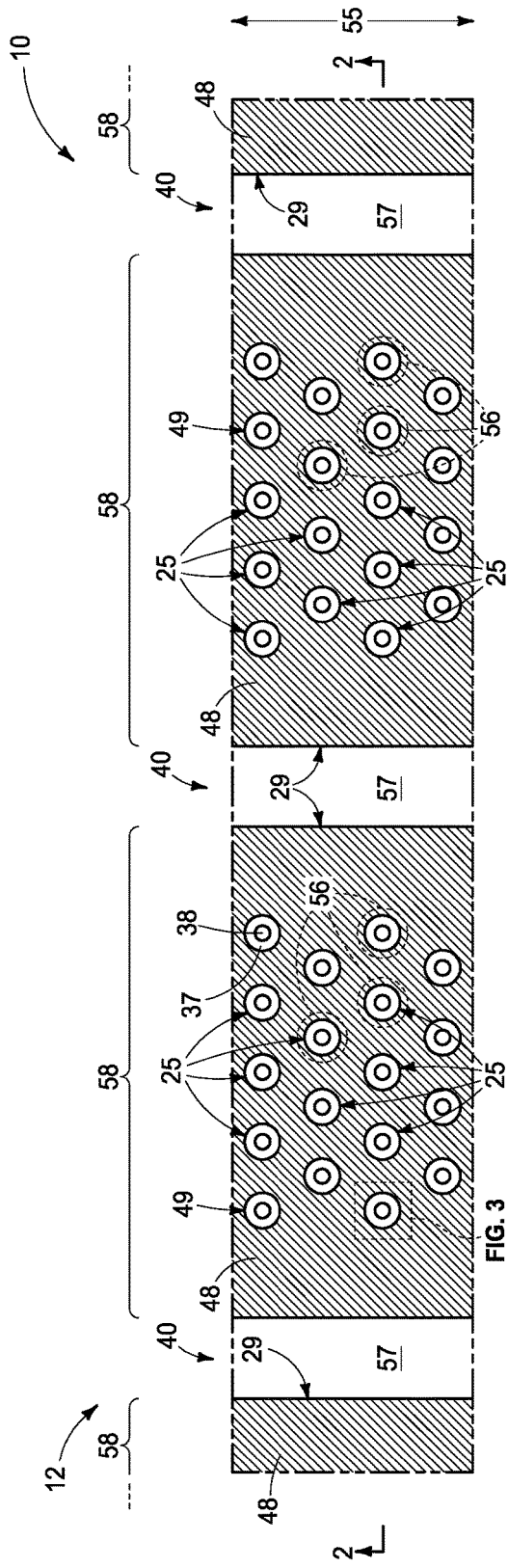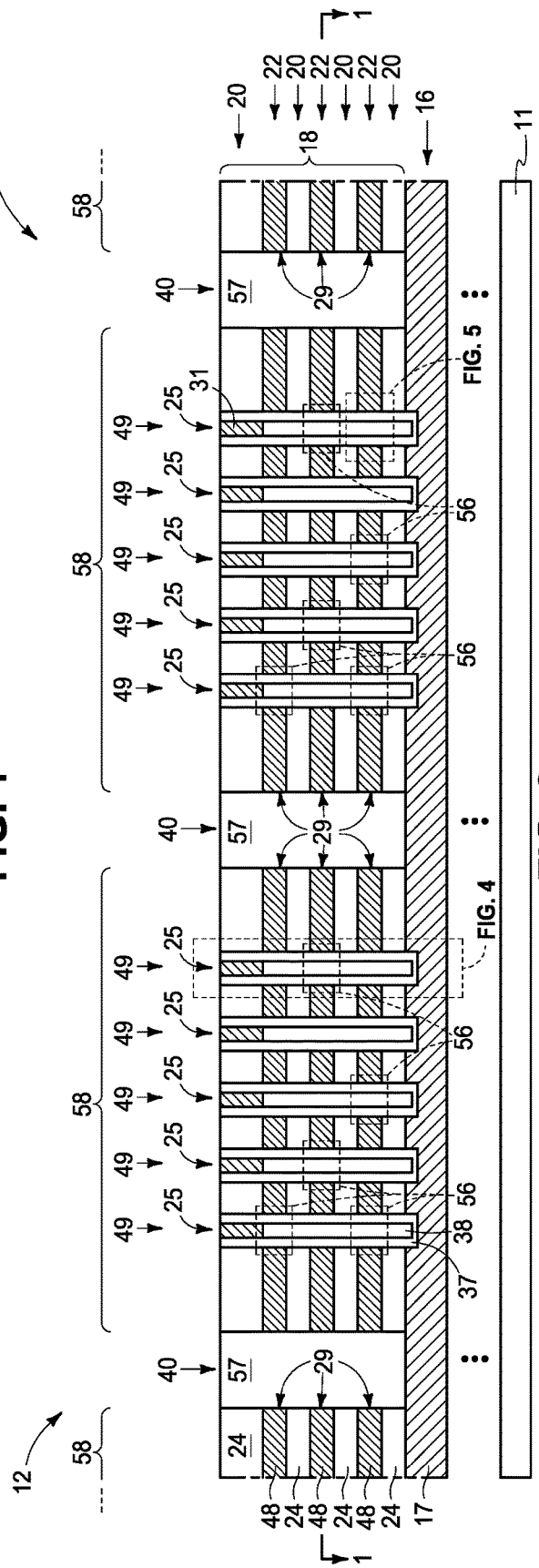

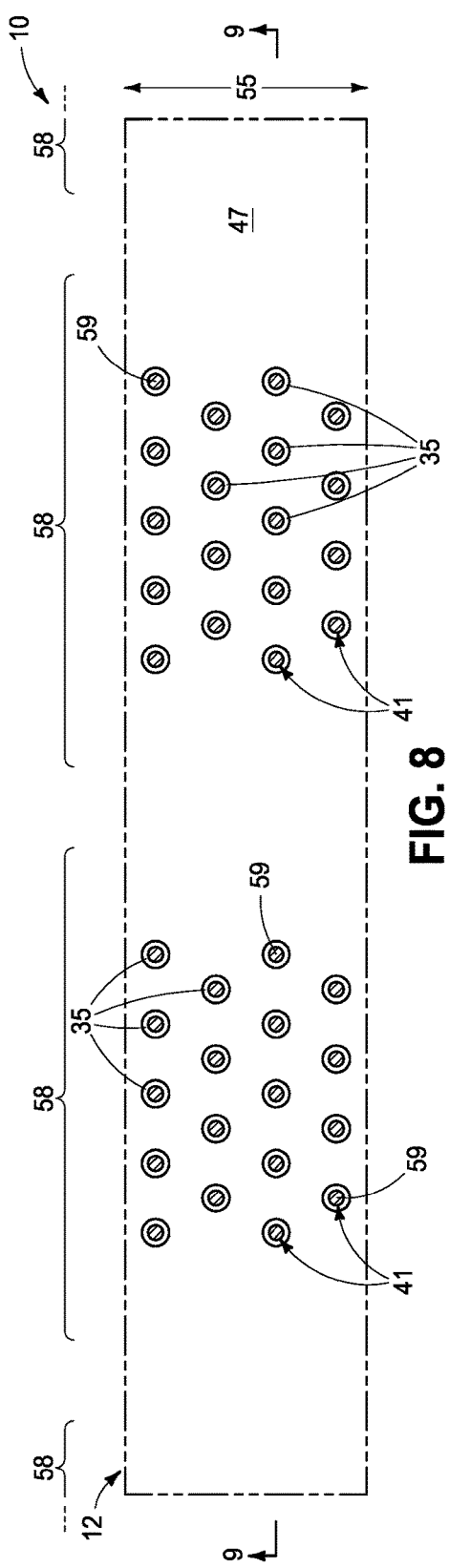
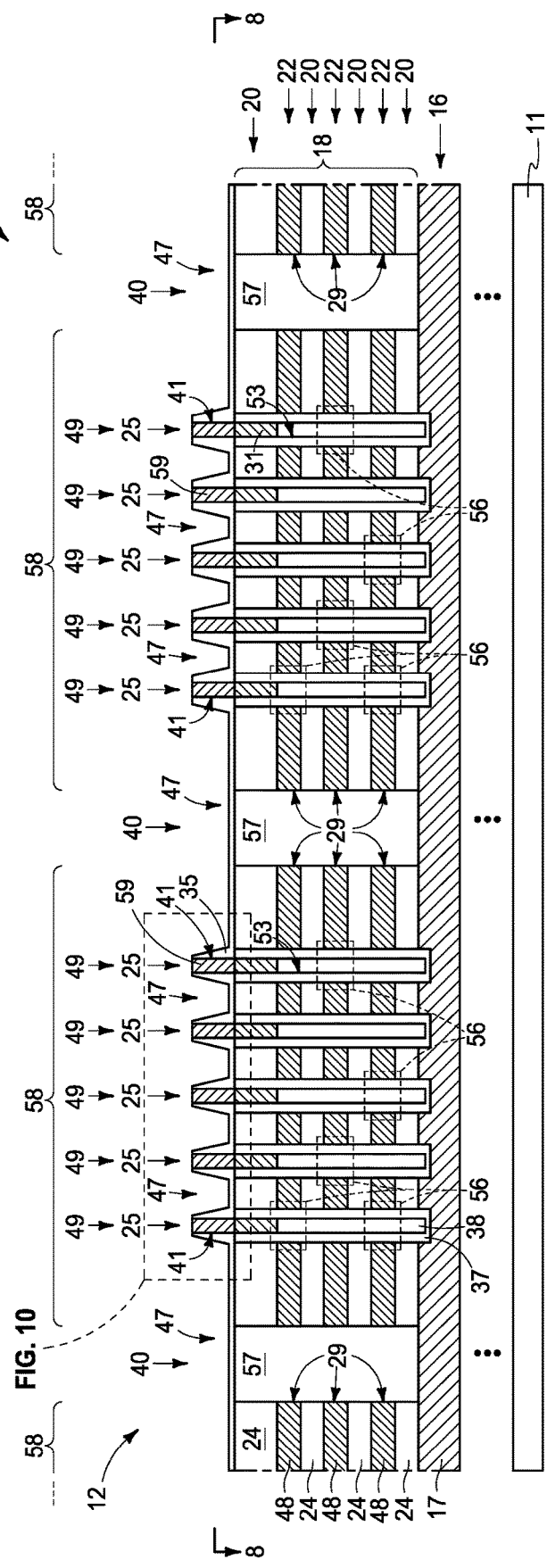
FIG. 8
FIG. 9

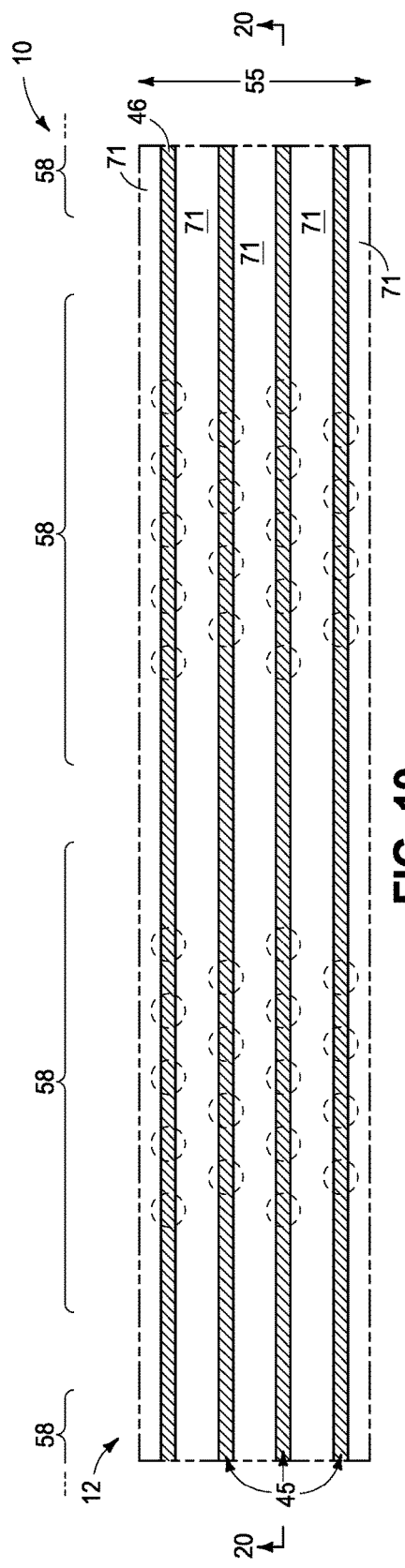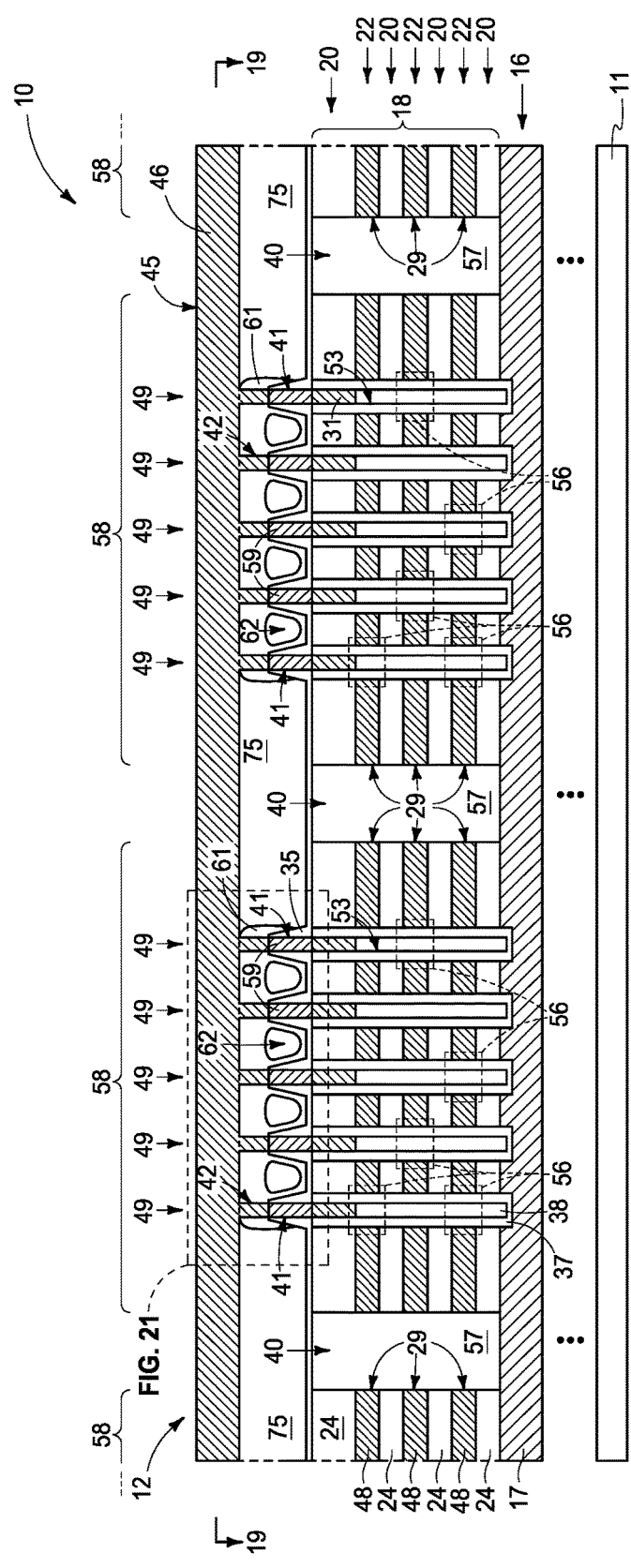

MEMORY ARRAY AND METHOD USED IN FORMING A MEMORY ARRAY

TECHNICAL FIELD

Embodiments disclosed herein pertain to memory array and to methods used in forming a memory array.

BACKGROUND

Memory is one type of integrated circuitry and is used in computer systems for storing data. Memory may be fabricated in one or more arrays of individual memory cells. Memory cells may be written to, or read from, using digitlines (which may also be referred to as bitlines, data lines, or sense lines) and access lines (which may also be referred to as wordlines). The sense lines may conductively interconnect memory cells along columns of the array, and the access lines may conductively interconnect memory cells along rows of the array. Each memory cell may be uniquely addressed through the combination of a sense line and an access line.

Memory cells may be volatile, semi-volatile, or non-volatile. Non-volatile memory cells can store data for extended periods of time in the absence of power. Non-volatile memory is conventionally specified to be memory having a retention time of at least about 10 years. Volatile memory dissipates and is therefore refreshed/rewritten to maintain data storage. Volatile memory may have a retention time of milliseconds or less. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field effect transistors may also include additional structure, for example a reversibly programmable charge-storage region as part of the gate construction between the gate insulator and the conductive gate.

Flash memory is one type of memory and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of integrated flash memory. A NAND cell unit comprises at least one selecting device coupled in series to a serial combination of memory cells (with the serial combination commonly being referred to as a NAND string). NAND architecture may be configured in a three-dimensional arrangement comprising vertically-stacked memory cells individually comprising a reversibly programmable vertical transistor. Control or other circuitry may be formed below the vertically-stacked memory cells. Other volatile or non-volatile memory array architectures may also comprise vertically-stacked memory cells that individually comprise a transistor.

Memory arrays may be arranged in memory pages, memory blocks and partial blocks (e.g., sub-blocks), and memory planes, for example as shown and described in any of U.S. Patent Application Publication Nos. 2015/0228651, 2016/0267984, and 2017/0140833. The memory blocks may at least in part define longitudinal outlines of individual wordlines in individual wordline tiers of vertically-stacked memory cells. Connections to these wordlines may occur in a so-called "stair-step structure" at an end or edge of an array of the vertically-stacked memory cells. The stair-step structure includes individual "stairs" (alternately termed "steps" or "stair-steps") that define contact regions of the individual wordlines upon which elevationally-extending conductive vias contact to provide electrical access to the wordlines.

BRIEF DESCRIPTION OF THE DRAWINGS

FIG. 1 is a diagrammatic cross-sectional view of a portion of a substrate in process in accordance with an embodiment of the invention and is taken through line 1-1 in FIG. 2.

FIG. 2 is a diagrammatic cross-sectional view taken through line 2-2 in FIG. 1.

FIGS. 6-21 are diagrammatic sequential sectional, expanded, enlarged, and/or partial views of the construction of FIGS. 1-5, or portions thereof, in process in accordance with some embodiments of the invention.

DETAILED DESCRIPTION OF EXAMPLE EMBODIMENTS

Figure 4:
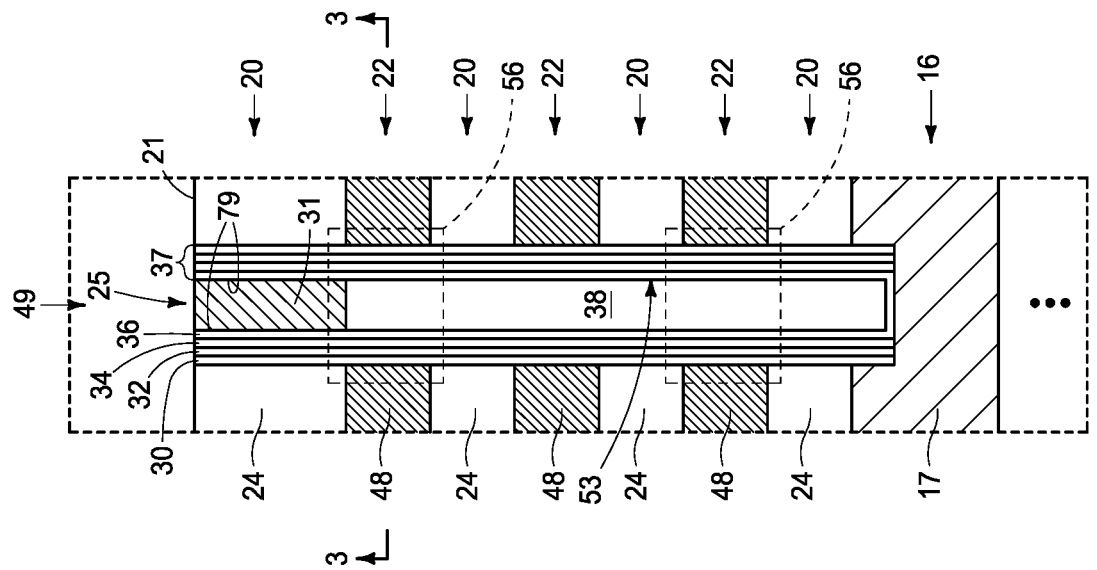
FIGS. 3-5 are enlarged views of portions of FIGS. 1 and 2.
Figure 3:
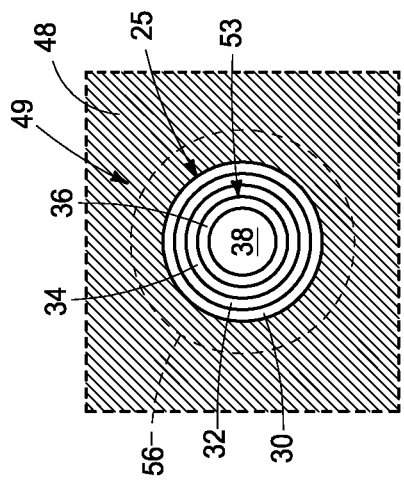
Figure 5:
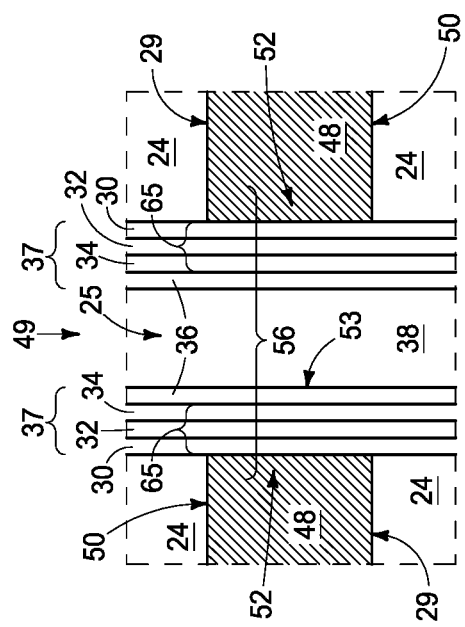

Embodiments of the invention encompass methods used in forming a memory array, for example an array of NAND or other memory cells that may have at least some peripheral control circuitry under the array (e.g., CMOS-under-array). Embodiments of the invention encompass so-called "gate-last" or "replacement-gate" processing, so-called "gate-first" processing, and other processing whether existing or future-developed independent of when transistor gates are formed. Embodiments of the invention also encompass a memory array (e.g., NAND architecture) independent of method of manufacture. First example method embodiments are described with reference to FIGS. 1-21.

FIGS. 1-5 show an example construction 10 having an array 12 in which elevationally-extending strings 49 of transistors and/or memory cells 56 have been formed. Such includes a base substrate 11 having any one or more of conductive/conductor/conducting, semiconductive/semi-conductor/semiconducting, or insulative/insulator/insulating (i.e., electrically herein) materials. Various materials have been formed elevationally over base substrate 11. Materials may be aside, elevationally inward, or elevationally outward of the FIGS. 1-5-depicted materials. For example, other partially or wholly fabricated components of integrated circuitry may be provided somewhere above, about, or within base substrate 11. Control and/or other peripheral circuitry for operating components within an array (e.g., array 12) of elevationally-extending strings of memory cells may also be fabricated and may or may not be wholly or partially within an array or sub-array. Further, multiple sub-arrays may also be fabricated and operated independently, in tandem, or otherwise relative one another. In this document, a "sub-array" may also be considered as an array.

A conductor tier 16 comprising conductor material 17 has been formed above substrate 11. Conductor tier 16 may comprise part of control circuitry (e.g., peripheral-under-array circuitry and/or a common source line or plate) used to control read and write access to the transistors and/or memory cells that will be formed within array 12. A stack 18 comprising vertically-alternating insulative tiers 20 and conductive tiers 22 has been formed above conductor tier 16. Example thickness for each of tiers 20 and 22 is 22 to 60 nanometers. The example uppermost tier 20 may be thicker/thickest compared to one or more other tiers 20 and/or 22. Only a small number of tiers 20 and 22 is shown, with more likely stack 18 comprising dozens, a hundred or more, etc. of tiers 20 and 22. Other circuitry that may or may not be part of peripheral and/or control circuitry may be between conductor tier 16 and stack 18. For example, multiple vertically-alternating tiers of conductive material and insulative material of such circuitry may be below a lowest of the conductive tiers 22 and/or above an uppermost of the conductive tiers 22. For example, one or more select gate tiers (not shown) may be between conductor tier 16 and the lowest conductive tier 22 and one or more select gate tiers may be above an uppermost of conductive tiers 22 (not shown). Alternately or additionally, at least one of the depicted uppermost and lowest conductive tiers 22 may be a select gate tier. Example insulative tiers 20 comprise insulative material 24 (e.g., silicon dioxide and/or other material that may be of one or more composition(s)).

Channel openings 25 have been formed (e.g., by etching) through insulative tiers 20 and conductive tiers 22 to conductor tier 16. Channel openings 25 may taper radially-inward (not shown) moving deeper in stack 18. In some embodiments, channel openings 25 may go into conductor material 17 of conductor tier 16 as shown or may stop there-atop (not shown). Alternately, as an example, channel openings 25 may stop atop or within the lowest insulative tier 20. A reason for extending channel openings 25 at least to conductor material 17 of conductor tier 16 is to assure direct electrical coupling of channel material to conductor tier 16 without using alternative processing and structure to do so when such a connection is desired. Etch-stop material (not shown) may be within or atop conductor material 17 of conductor tier 16 to facilitate stopping of the etching of channel openings 25 relative to conductor tier 16 when such is desired. Such etch-stop material may be sacrificial or non-sacrificial. By way of example and for brevity only, channel openings 25 are shown as being arranged in groups or columns of staggered rows of four and five openings 25 per row and being arrayed in laterally-spaced memory blocks 58. In this document, "block" is generic to include "sub-block". Memory blocks 58 may be considered as being longitudinally elongated and oriented, for example along a direction 55. Any alternate existing or future-developed arrangement and construction may be used.

Example memory blocks 58 are shown as at least in part having been defined by horizontally-elongated trenches 40 that were formed (e.g., by anisotropic etching) into stack 18. Trenches 40 may have respective bottoms that are directly against conductor material 17 (e.g., atop or within) of conductor tier 16 (as shown) or may have respective bottoms that are above conductor material 17 of conductor tier 16 (not shown). Intervening material 57 is in trenches 40 in stack 18 and may provide lateral electrical isolation (insulation) between immediately-laterally-adjacent memory blocks 58. Such may include one or more of insulative, semiconductive, and conducting materials and, regardless, may facilitate conductive tiers 22 from shorting relative one another in a finished circuitry construction. Example insulative materials are one or more of $SiO_2$, $Si_3N_4$, $Al_2O_3$, and undoped polysilicon. Intervening material 57 may include through array vias (TAV's) and not shown.

Transistor channel material may be formed in the individual channel openings elevationally along the insulative tiers and the conductive tiers, thus comprising individual channel-material strings, which is directly electrically coupled with conductive material in the conductor tier. Individual memory cells of the example memory array being formed may comprise a gate region (e.g., a control-gate region) and a memory structure laterally-between the gate region and the channel material. In one such embodiment, the memory structure is formed to comprise a charge-blocking region, storage material (e.g., charge-storage material), and an insulative charge-passage material. The storage material (e.g., floating gate material such as doped or undoped silicon or charge-trapping material such as silicon nitride, metal dots, etc.) of the individual memory cells is elevationally along individual of the charge-blocking regions. The insulative charge-passage material (e.g., a band gap-engineered structure having nitrogen-containing material [e.g., silicon nitride] sandwiched between two insulator oxides [e.g., silicon dioxide]) is laterally-between the channel material and the storage material.

FIGS. 1-5 show one embodiment wherein charge-blocking material 30, storage material 32, and charge-passage material 34 have been formed in individual channel openings 25 elevationally along insulative tiers 20 and conductive tiers 22. Transistor materials 30, 32, and 34 (e.g., memory-cell materials) may be formed by, for example, deposition of respective thin layers thereof over stack 18 and within individual channel openings 25 followed by planarizing such back at least to a top surface of stack 18.

Channel material 36 has also been formed in channel openings 25 elevationally along insulative tiers 20 and conductive tiers 22 and comprise individual operative channel-material strings 53 in one embodiment having memory-cell materials (e.g., 30, 32, and 34) there-along and with material 24 in insulative tiers 20 being horizontally-between immediately-adjacent channel-material strings 53. Materials 30, 32, 34, and 36 are collectively shown as and only designated as material 37 in FIGS. 1 and 2 due to scale. Example channel materials 36 include appropriately-doped crystalline semiconductor material, such as one or more silicon, germanium, and so-called III/V semiconductor materials (e.g., GaAs, InP, GaP, and GaN). Example thickness for each of materials 30, 32, 34, and 36 is 25 to 100 Angstroms. Punch etching may be conducted as shown to remove materials 30, 32, and 34 from the bases of channel openings 25 to expose conductor tier 16 such that channel material 36 is directly against conductor material 17 of conductor tier 16. Such punch etching may occur separately with respect to each of materials 30, 32, and 34 (as shown) or may occur collectively with respect to all after deposition of material 34 (not shown). Alternately, and by way of example only, no punch etching may be conducted and channel material 36 may be directly electrically coupled to conductor material 17 of conductor tier 16 by a separate conductive interconnect (not shown). Channel openings 25 are shown as comprising a radially-central solid dielectric material 38 (e.g., spin-on-dielectric, silicon dioxide, and/or silicon nitride). Alternately, and by way of example only, the radially-central portion within channel openings 25 may include void space(s) (not shown) and/or be devoid of solid material (not shown). Regardless, and in one embodiment, conducting material 31 (e.g., a conductive plug/via comprising conductively-doped polysilicon) is directly against laterally-inner sides 79 in an upper portion of individual channel-material strings 53. One or more of materials 30, 32, 34, and 36 may not extend to the top of conducting material 31 (not shown). Further, and regardless, conducting material 31 may not extend to the top of stack 18 (not shown), may extend above stack 18 (not shown), and/or may extend below the bottom of uppermost tier 20 (not shown).

Example conductive tiers 22 comprise conducting material 48 that is part of individual conductive lines 29 (e.g., wordlines) that are also part of elevationally-extending strings 49 of individual transistors and/or memory cells 56. A thin insulative liner (e.g., $Al_2O_3$ and not shown) may be formed before forming conducting material 48. Approximate locations of transistors and/or memory cells 56 are indicated with a bracket in or with dashed outlines, with transistors and/or memory cells 56 being essentially ring-like or annular in the depicted example. Alternately, transistors and/or memory cells 56 may not be completely encircling relative to individual channel openings 25 such that each channel opening 25 may have two or more elevationally-extending strings 49 (e.g., multiple transistors and/or memory cells about individual channel openings in individual conductive tiers with perhaps multiple wordlines per channel opening in individual conductive tiers, and not shown). Conducting material 48 may be considered as having terminal ends 50 corresponding to control-gate regions 52 of individual transistors and/or memory cells 56. Control-gate regions 52 in the depicted embodiment comprise individual portions of individual conductive lines 29. Materials 30, 32, and 34 may be considered as a memory structure 65 that is laterally-between control-gate region 52 and channel material 36.

A charge-blocking region (e.g., charge-blocking material 30) is between storage material 32 and individual control-gate regions 52. A charge block may have the following functions in a memory cell: In a program mode, the charge block may prevent charge carriers from passing out of the storage material (e.g., floating-gate material, charge-trapping material, etc.) toward the control gate, and in an erase mode the charge block may prevent charge carriers from flowing into the storage material from the control gate. Accordingly, a charge block may function to block charge migration between the control-gate region and the storage material of individual memory cells. An example charge-blocking region as shown comprises insulator material 30. By way of further examples, a charge-blocking region may comprise a laterally (e.g., radially) outer portion of the storage material (e.g., material 32) where such storage material is insulative (e.g., in the absence of any different-composition material between an insulative storage material 32 and conducting material 48). Regardless, as an additional example, an interface of a storage material and conductive material of a control gate may be sufficient to function as a charge-blocking region in the absence of any separate-composition-insulator material 30. Further, an interface of conducting material 48 with material 30 (when present) in combination with insulator material 30 may together function as a charge-blocking region, and as alternately or additionally may a laterally-outer region of an insulative storage material (e.g., a silicon nitride material 32). An example material 30 is one or more of silicon hafnium oxide and silicon dioxide.

Figure 6:
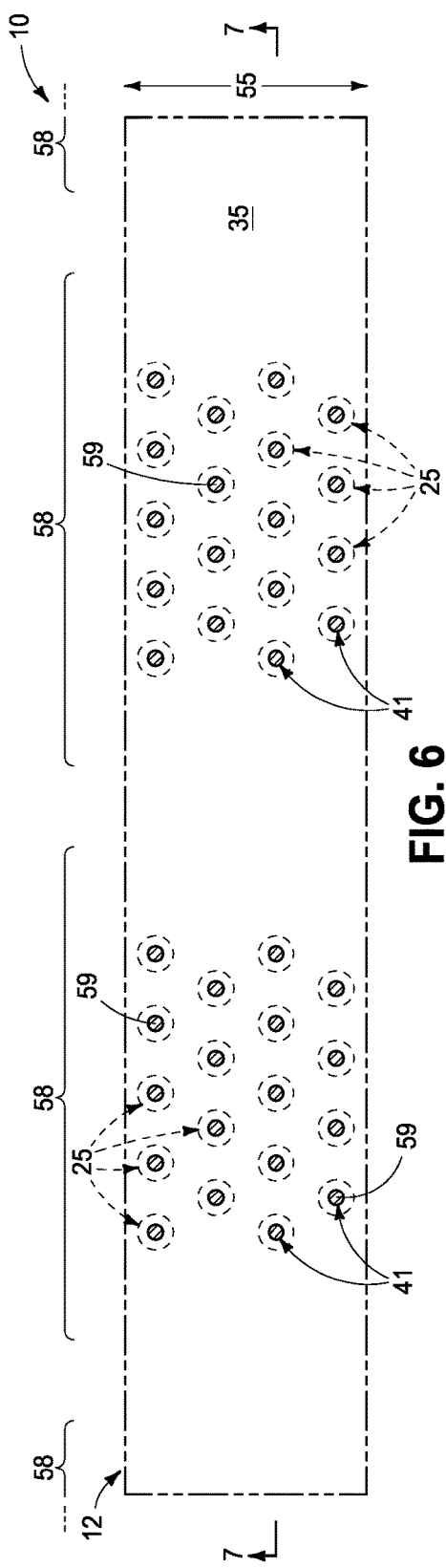
Figure 7:
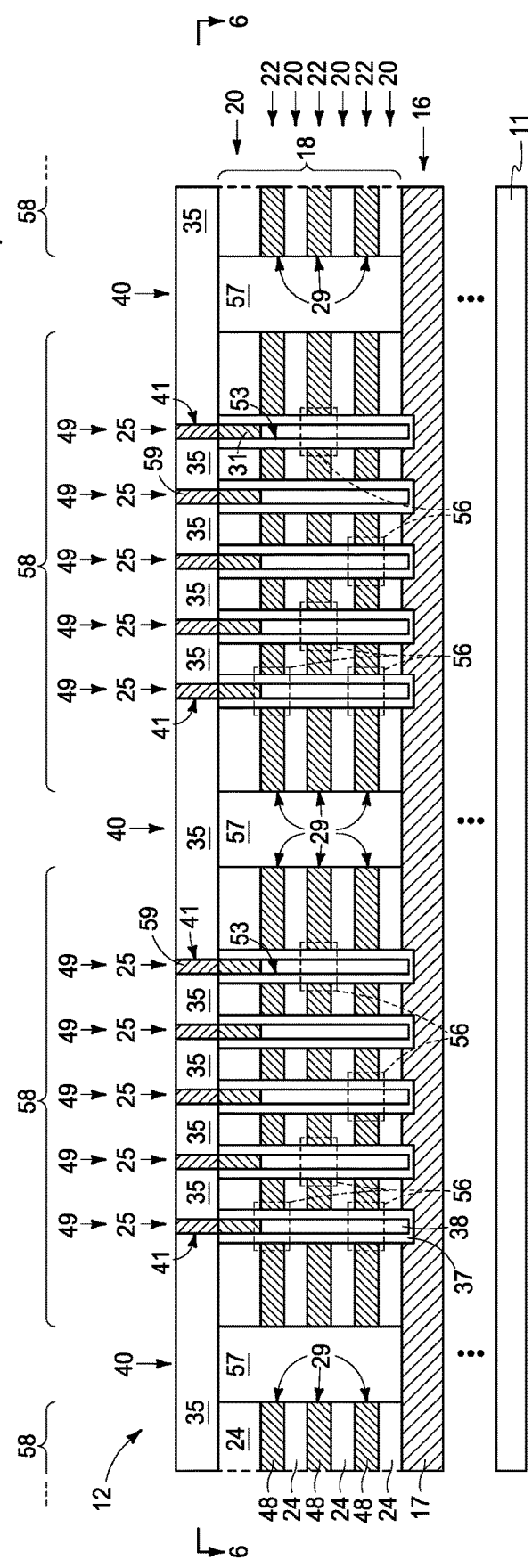

Referring to FIGS. 6 and 7, conductive vias 41 (e.g., first conductive vias 41) comprising conductive material 59 (e.g., metal material and/or conductively-doped polysilicon) have been formed above and individually electrically coupled to (e.g., directly electrically coupled to) individual channel material strings 53 (e.g., through conducting material 31). Conductive vias 41 may taper laterally inward or laterally outward in the vertical cross-section that is FIG. 9 (not shown). Insulating material 35 (e.g., silicon dioxide and/or silicon nitride) is laterally-between immediately-adjacent conductive vias 41.

Figure 10:
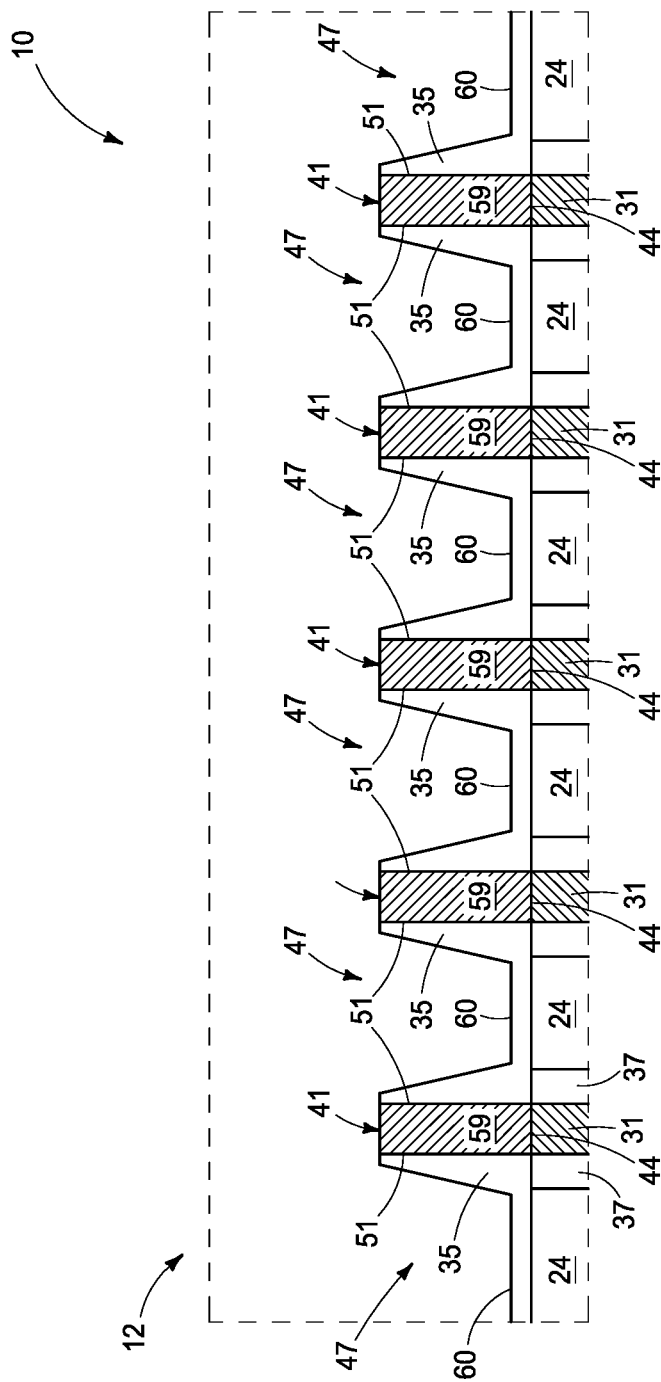

Referring to FIGS. 8-10 at least some of insulating material 35 has been vertically removed to form an upwardly-open void-space 47 that is circumferentially about multiple conductive vias 41. In one embodiment, such vertical removing comprises etching, for example that may be isotropic, anisotropic, wet, dry, using remote or direct plasma, that may be maskless (e.g., no mask being formed above some or all of construction 10), use masking material, etc. Regardless, in one embodiment the vertically removing forms the bottom 60 of upwardly-open void-space 47 to be at or above (above being shown) bottoms 44 of individual conductive vias 41. In one embodiment, the vertical removing leaves some of insulating material 35 circumferentially about an uppermost portion of lateral sidewalls 51 of individual conductive vias 41 and in one such embodiment as shown leaves some of insulating material 35 circumferentially about all of lateral sidewalls 51 of individual conductive vias 41.

Figure 11:
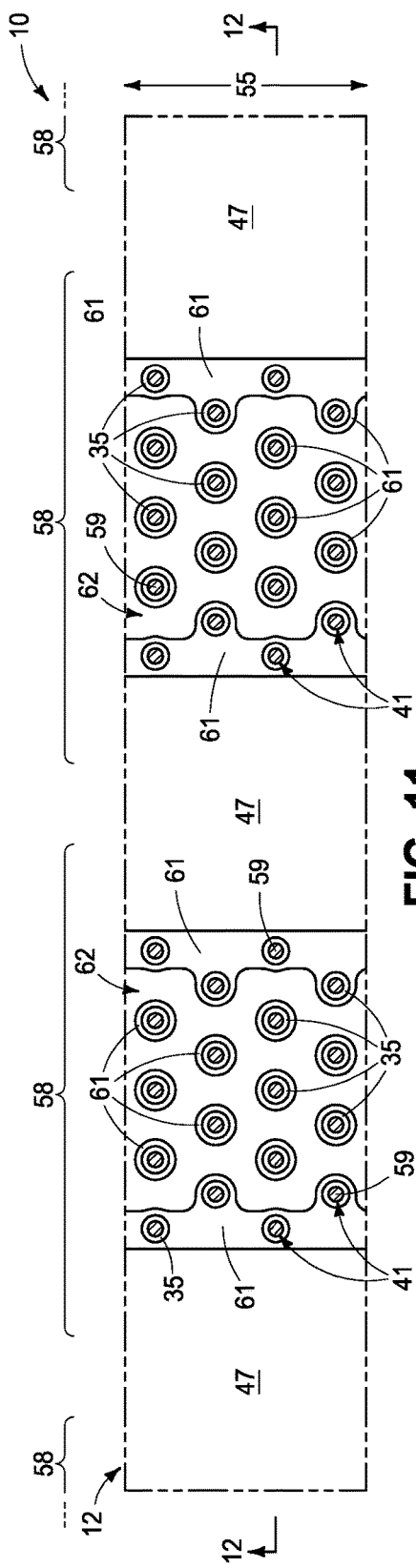
Figure 12:
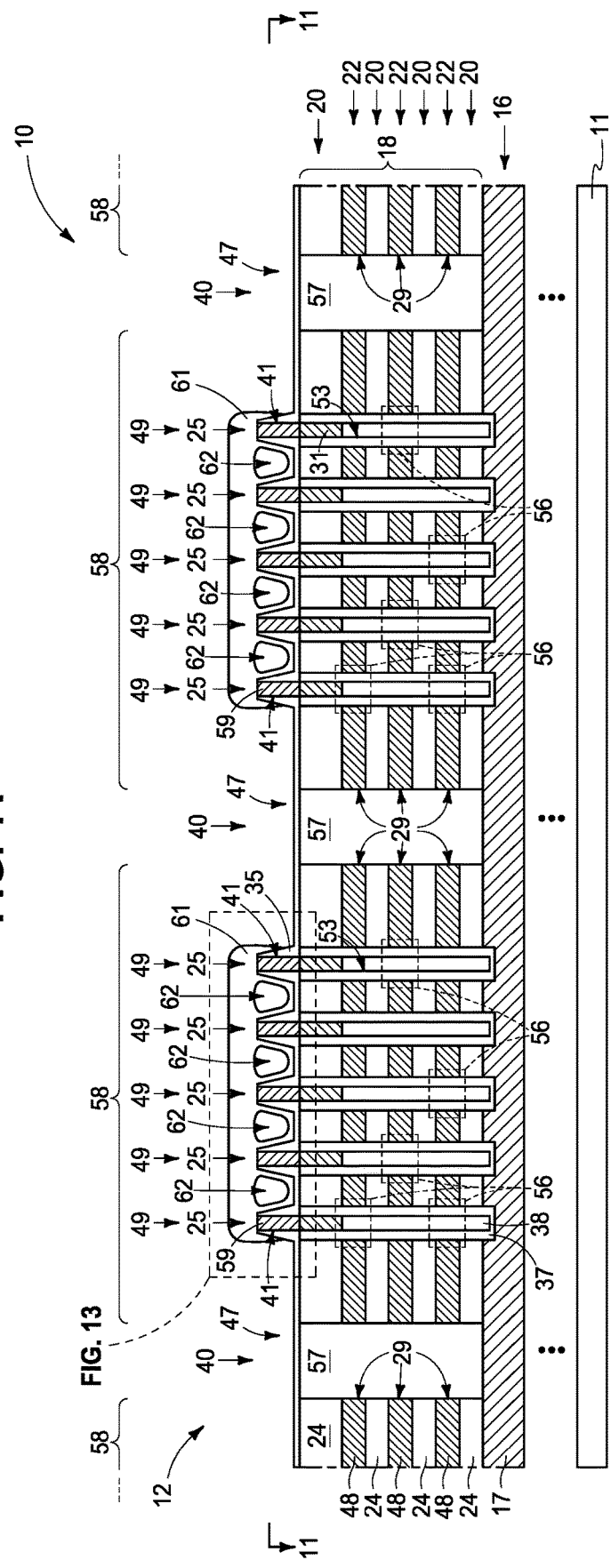
Figure 13:
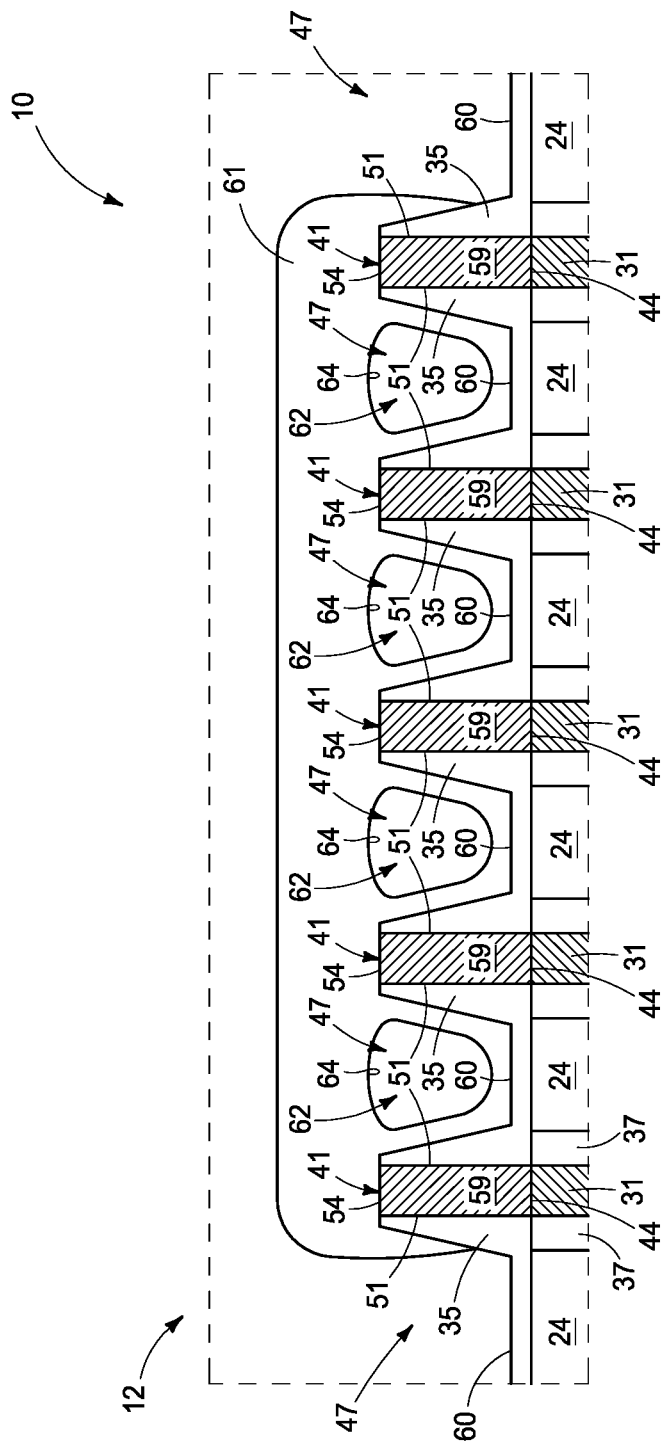
Figure 14:
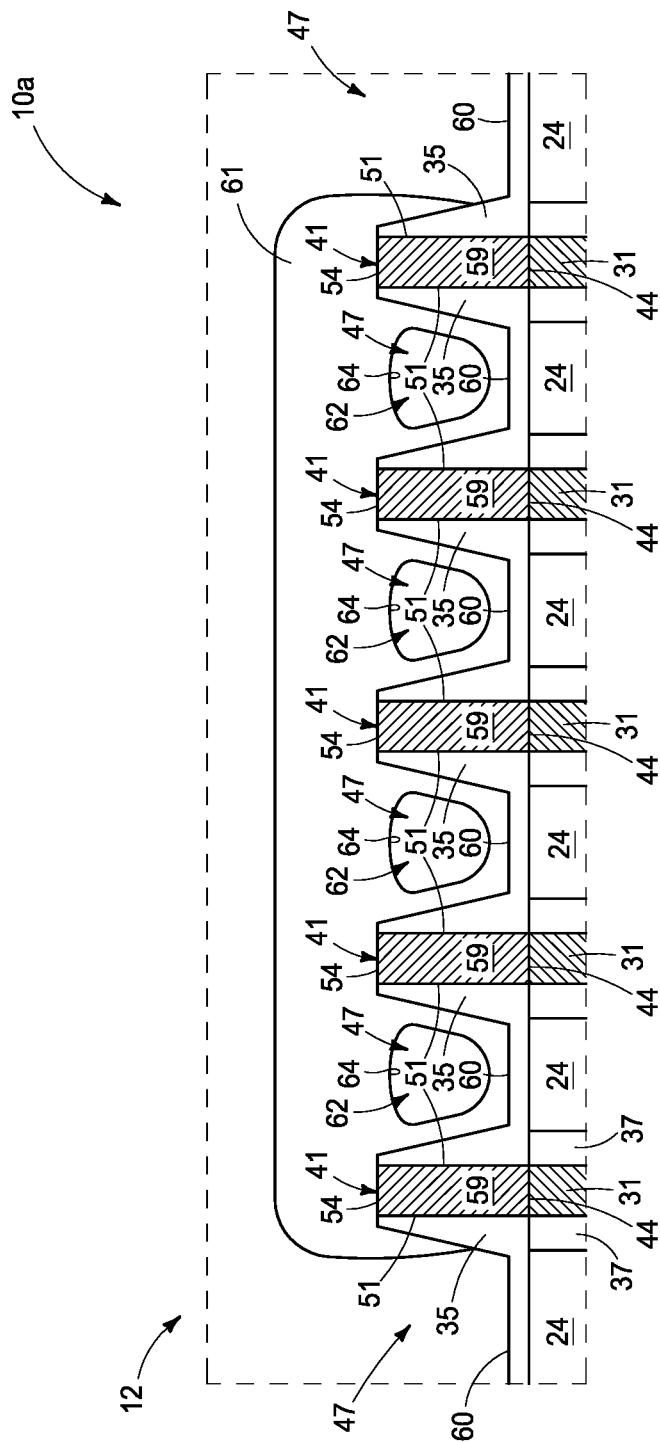
Figure 15:
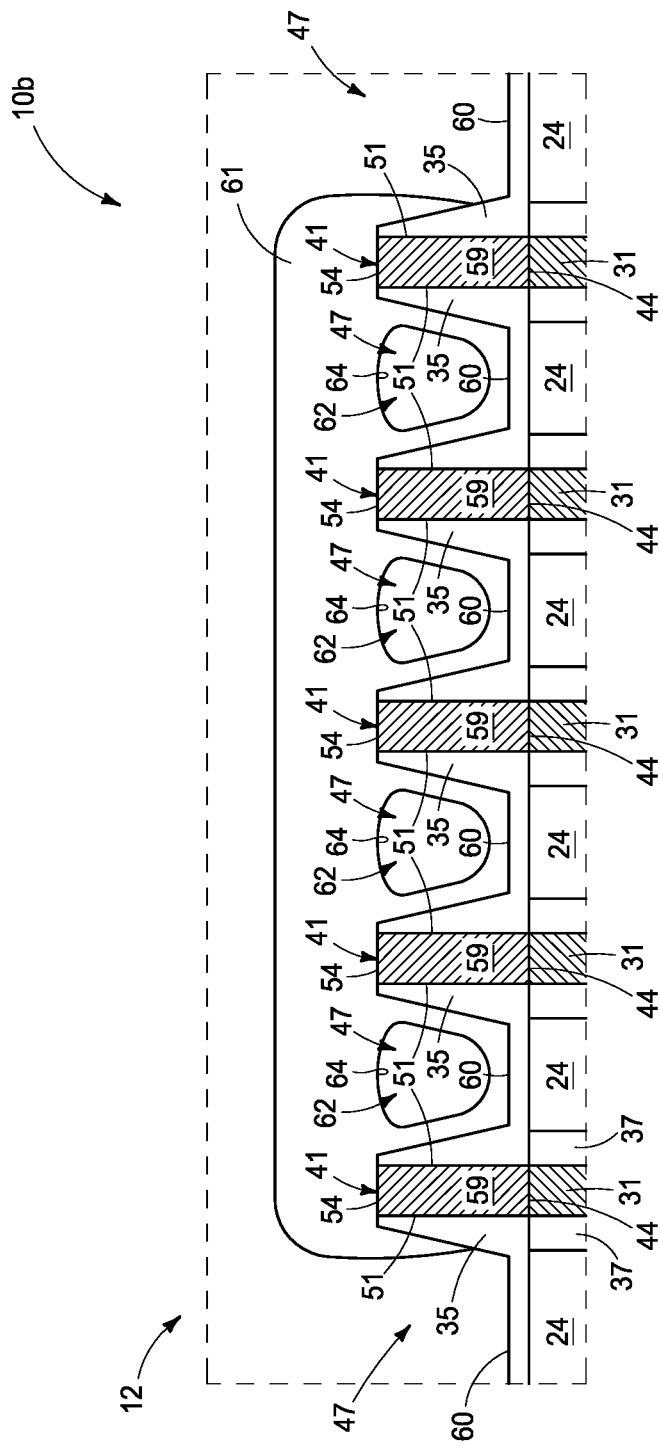

Referring to FIGS. 11-13, insulative material 61 (e.g., silicon dioxide and/or silicon nitride) has been formed laterally between immediately-adjacent conductive vias 41 to form a covered void-space 62 from upwardly-open void-space 47 (e.g., from FIGS. 8-10). In one embodiment and as shown, insulative material 61 has been formed to be directly above tops 54 of individual conductive vias 41 and in one embodiment to be all across tops 54. In one embodiment and as shown, the forming of insulative material 61 is directly against bottom 60 of (former) upwardly-open void-space 47. Alternately, such insulative material is not directly against such bottom (not shown). In one embodiment, the forming of insulative material 61 forms the top 64 of covered void-space 62 above tops 54 of individual conductive vias 41. Alternately, the forming of insulative material 61 may form top 64 of covered void-space 62 below tops 54 of individual conductive vias 41 (construction 10a in FIG. 14) or alternately to be elevationally-coincident with tops 54 of individual conductive vias 41 (construction 10b in FIG. 15).

Any suitable deposition method may be used for insulative material 61 in some manner that is sufficiently non-conformal at least aside conductive vias 41 such that covered void-space 62 is formed (e.g., that maximizes a so-called bread-loafing effect) as will be appreciated by the artisan. Insulative material 61 may extend laterally-between immediately-adjacent memory blocks 58 (not shown) or may not so extend (as shown).

As an example, and in one embodiment, the forming of insulative material 61 comprises a selective deposition of insulative material 61 from conductive material 59 of individual conductive vias 41, and in one such embodiment comprises a selective deposition of insulative material 61 from conductive material 59 of tops 54 of individual conductive vias 41 (e.g., not from lateral sidewalls 51 of conductive material 59 of individual conductive vias 51). Alternately, and by way of example, if some of conductive material 59 of lateral sidewalls 51 is exposed (not shown), selective deposition of insulative material may also occur therefrom (not shown).

The artisan is capable of selecting such selective deposition techniques, and exposed portions of certain materials (e.g., insulating material 35) may be treated prior to such act of selectively growing to enable such selectively growing. As an example, silicon dioxide can be deposited selectively relative to tungsten. Specifically, silicon dioxide surfaces can first be inhibited from silicon dioxide growth by exposure to (N,N-dimethyamino)-trimethylsilane (DMATMS) or bis(N,N-dimethylamino)-dimethylsilane (DMADMS), hexamethyl-disilazane (HMDS), 1H,1H,2H,2H-perfluorooctyl-trichlorosilane (FOTS or PFOCTS), or heptadecafluoro-1,1,2,2-tetrahydrodecyl) triethoxysilane (HDFTEOS) that only bonds to hydroxy groups to effectively functionalize the silicon dioxide surfaces from being deposited upon by silicon dioxide. Thereafter, silicon dioxide (containing trace carbon) can be grown by atomic layer deposition from other surfaces that have not been so-functionalized (even if exposed to any of the DMATMS, DMADMS, HMDS, FOTS, or HDFTEOS), for example using tetraethyl orthosilicate (TEOS) at a pedestal temperature of 300° C. to 500° C., pressure of 100 Torr to 500 Torr, TEOS flow rate of 1,000 sccm to 20,000 sccm, and $O_3$ flow at 100 sccm to 17,000 sccm.

As another example, spin-on dielectric (SOD) composed of perhydro-polysilazane will also selectively deposit on tungsten relative to silicon dioxide that has been first inhibited as described above. SOD may be selectively deposited onto tungsten room temperature followed by baking at 150° C. If baked in an ambient of $N_2$, oxynitride will be formed. Regardless, after baking, it can be densified in steam at 500° C. to 1,000° C.

Further, $SiO_xN_y$ can be deposited on a metal surface selectively relative to silicon dioxide first inhibited as described above using $SiH_4$ with one or more of $N_2O$, $CO_2$ and $NH_3$, for example at 375° C., pressure of 1 Torr to 10 Torr, RF power of 100 W to 200 W and gas flows of 90 sccm to 900 sccm.

Additionally, $Si_6N_4$ can be deposited on a metal surface selectively relative to silicon dioxide first inhibited as described above using $SiH_4$ and $NH_3$, for example at 400° C., pressure of 1 Torr to 10 Torr, RF power of 300 W to 400 W, $SiH_4$ flow of 500 sccm to 700 sccm, and $NH_3$ flow from 3,000 sccm to 5,000 sccm.

Figure 16:
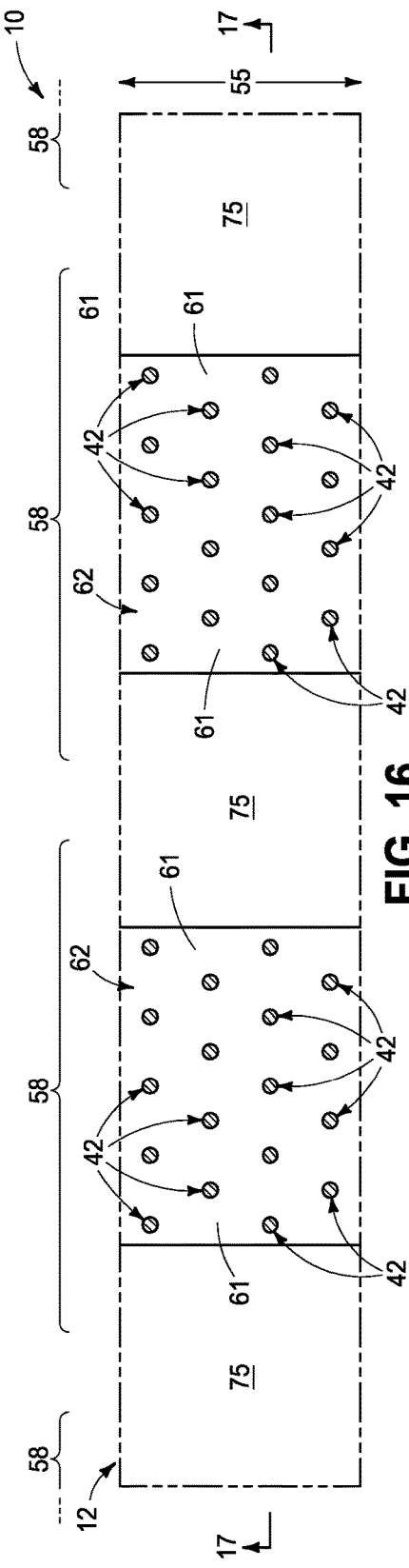
Figure 17:
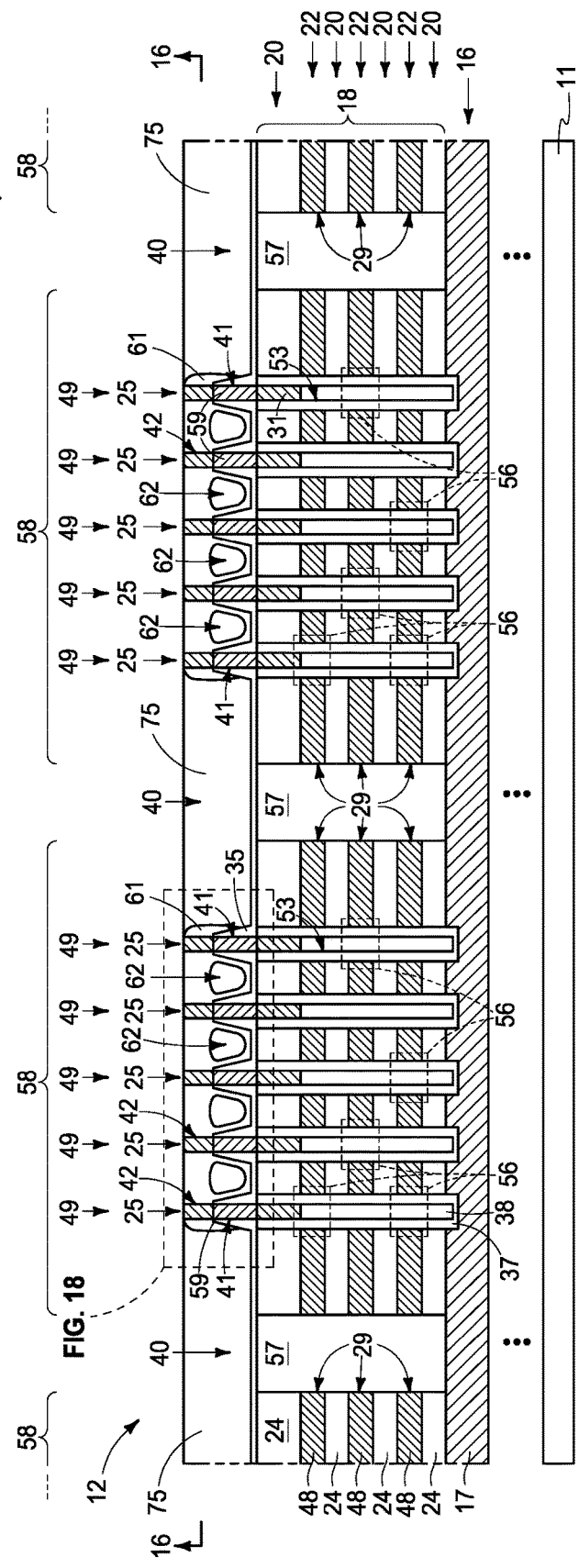
Figure 18:
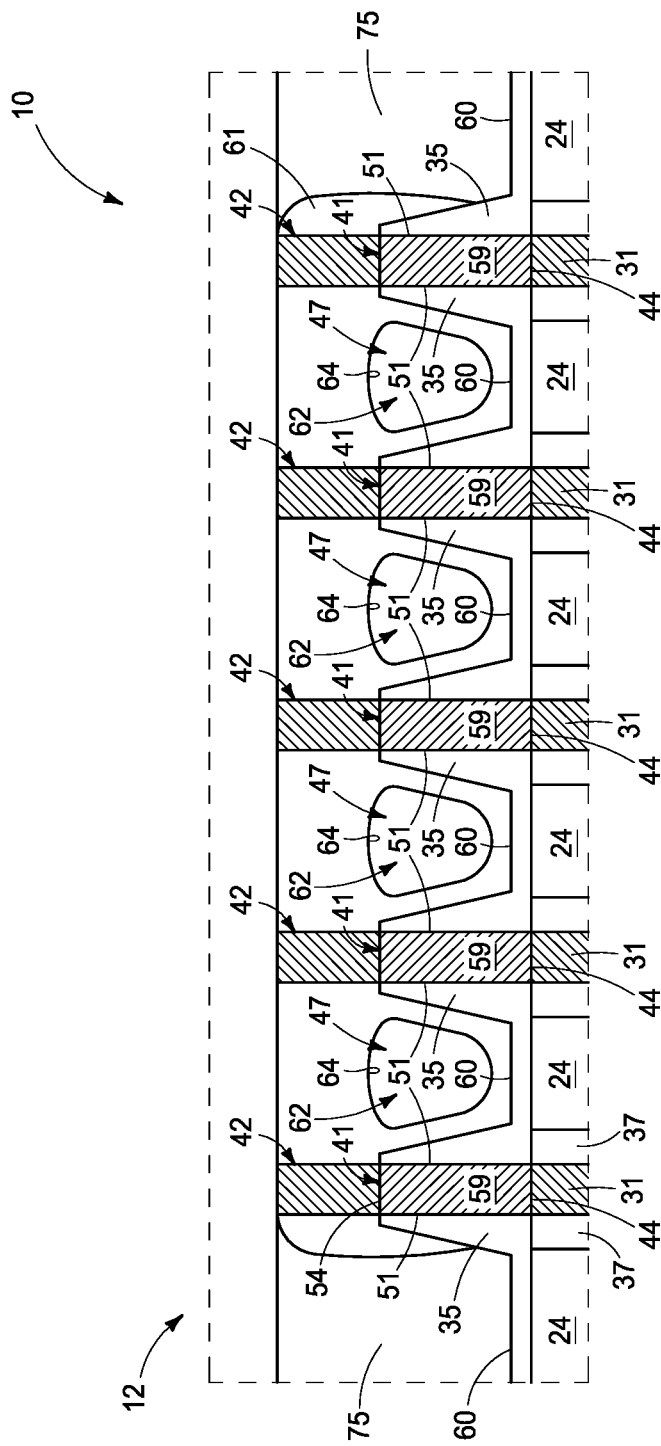

Referring to FIGS. 16-18, and in one embodiment, second conductive vias 42 have been formed above and individually directly electrically coupled to individual first conductive vias 41 (e.g., through insulative material 61). In one example, insulative material 75 (e.g., silicon dioxide and/or silicon nitride) has been deposited and planarized, for example planarized back at least to the top surface of insulative material 61. Second conductive vias 42 and first conductive vias 41 may be of the same or different composition(s) relative one another. Second conductive vias 42 may be laterally wider or narrower than first conductive vias 41 (not shown) and/or, regardless, may taper laterally inward or laterally outward in the vertical cross-section that is FIGS. 17 and 18 (not shown).

Figure 21:
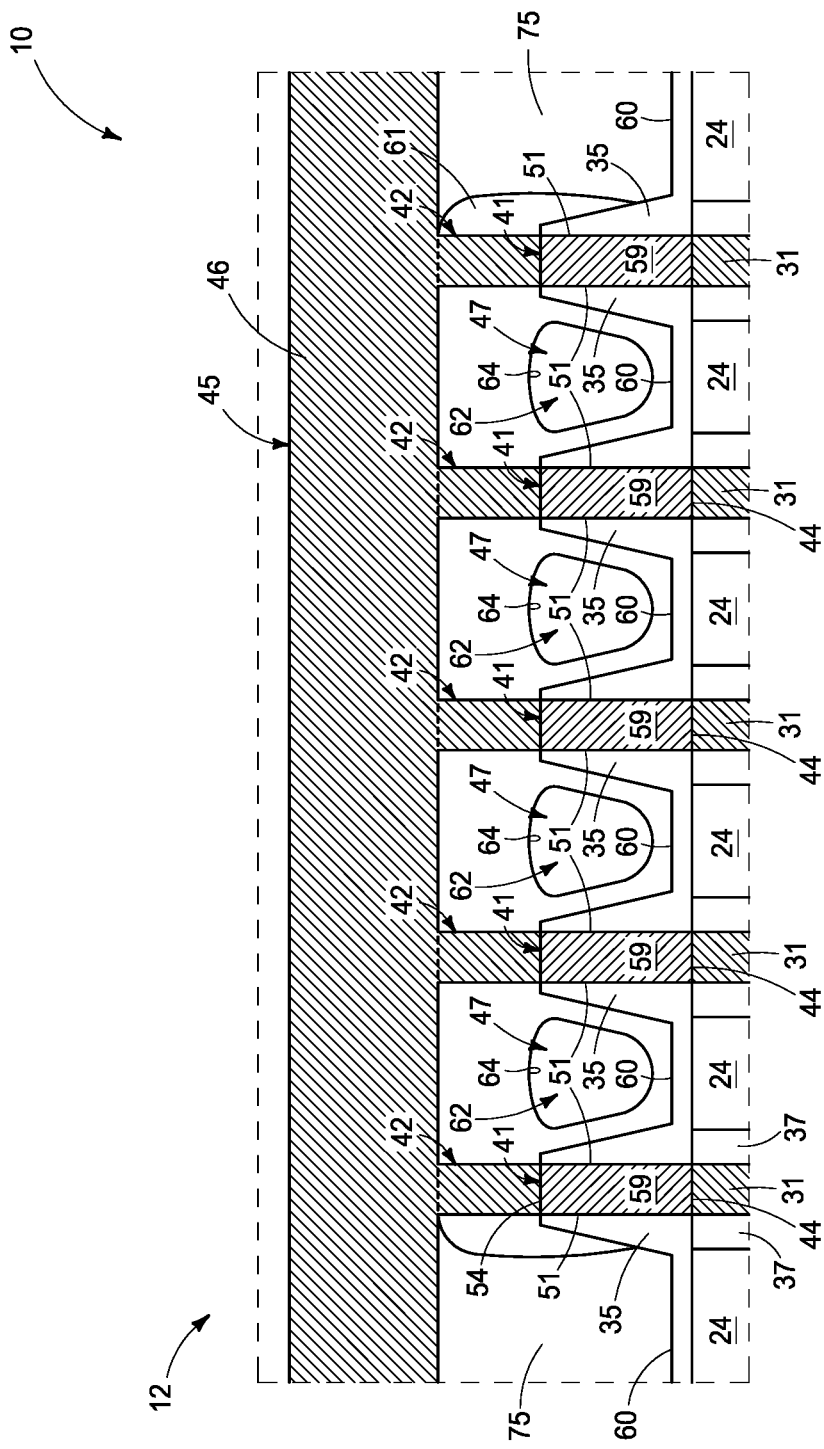

Referring to FIGS. 19-21, and in one embodiment, digitlines 45 comprising conductive material 46 have been formed above and that are individually directly electrically coupled to a plurality individual of second conductive vias 42 there-below. Digitlines 45, second conductive vias 42, and/or first conductive vias 41 may be of the same or different composition(s) relative one another. Further, and by way of example, second conductive vias 42 may be eliminated whereby the digitlines are above and directly against conductive material of first conductive vias 41 (not shown). Example insulative material 71 (e.g., silicon dioxide and/or silicon nitride; FIG. 19) is shown between digitlines 45.

Any other attribute(s) or aspect(s) as shown and/or described herein with respect to other embodiments may be used in the embodiments shown and described with reference to FIGS. 1-21.

Alternate embodiment constructions may result from method embodiments described above, or otherwise. Regardless, embodiments of the invention encompass memory arrays independent of method of manufacture. Nevertheless, such memory arrays may have any of the attributes as described herein in method embodiments. Likewise, the above-described method embodiments may incorporate, form, and/or have any of the attributes described with respect to device embodiments.

In one embodiment, a memory array (e.g., 12) comprises a stack (e.g., 18) comprising vertically-alternating insulative tiers (e.g., 20) and conductive tiers (e.g., 22). Channel-material strings (e.g., 53) of memory-cell strings (e.g., 49) extend through the insulative and conductive tiers. Digitlines (e.g., 45) are above and electrically coupled to the channel-material strings by conductive vias (e.g., 41) that are individually above individual of the channel-material strings and below individual of the digitlines. A covered void-space (e.g., 62) is circumferentially about multiple of individual of the conductive vias in a horizontal cross-section (e.g., that of FIG. 11). Any other attribute(s) or aspect(s) as shown and/or described herein with respect to other embodiments may be used.

In one embodiment, a memory array (e.g., 12) comprises a stack (e.g., 18) comprising vertically-alternating insulative tiers (e.g., 20) and conductive tiers (e.g., 22). Channel-material strings (e.g., 53) of memory-cell strings (e.g., 49) extend through the insulative and conductive tiers. First conductive vias (e.g., 41) are above and individually directly electrically couple to individual of the channel-material strings. Second conductive vias (e.g., 42) are above and individually directly electrically coupled to individual of the first conductive vias. Digitlines (e.g., 45) are above and are individually directly electrically coupled to a plurality of individual of the second conductive vias there-below. A covered void-space (e.g., 62) is circumferentially about multiple of the individual first conductive vias in a horizontal cross-section (e.g., that of FIG. 11). Any other attribute(s) or aspect(s) as shown and/or described herein with respect to other embodiments may be used.

The above processing(s) or construction(s) may be considered as being relative to an array of components formed as or within a single stack or single deck of such components above or as part of an underlying base substrate (albeit, the single stack/deck may have multiple tiers). Control and/or other peripheral circuitry for operating or accessing such components within an array may also be formed anywhere as part of the finished construction, and in some embodiments may be under the array (e.g., CMOS under-array). Regardless, one or more additional such stack(s)/deck(s) may be provided or fabricated above and/or below that shown in the figures or described above. Further, the array(s) of components may be the same or different relative one another in different stacks/decks and different stacks/decks may be of the same thickness or of different thicknesses relative one another. Intervening structure may be provided between immediately-vertically-adjacent stacks/decks (e.g., additional circuitry and/or dielectric layers). Also, different stacks/decks may be electrically coupled relative one another. The multiple stacks/decks may be fabricated separately and sequentially (e.g., one atop another), or two or more stacks/decks may be fabricated at essentially the same time.

The assemblies and structures discussed above may be used in integrated circuits/circuitry and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

In this document unless otherwise indicated, "elevational", "higher", "upper", "lower", "top", "atop", "bottom", "above", "below", "under", "beneath", "up", and "down" are generally with reference to the vertical direction. "Horizontal" refers to a general direction (i.e., within 10 degrees) along a primary substrate surface and may be relative to which the substrate is processed during fabrication, and vertical is a direction generally orthogonal thereto. Reference to "exactly horizontal" is the direction along the primary substrate surface (i.e., no degrees there-from) and may be relative to which the substrate is processed during fabrication. Further, "vertical" and "horizontal" as used herein are generally perpendicular directions relative one another and independent of orientation of the substrate in three-dimensional space. Additionally, "elevationally-extending" and "extend(ing) elevationally" refer to a direction that is angled away by at least 45° from exactly horizontal. Further, "extend(ing) elevationally", "elevationally-extending", "extend(ing) horizontally", "horizontally-extending" and the like with respect to a field effect transistor are with reference to orientation of the transistor's channel length along which current flows in operation between the source/drain regions. For bipolar junction transistors, "extend(ing) elevationally" "elevationally-extending", "extend(ing) horizontally", "horizontally-extending" and the like, are with reference to orientation of the base length along which current flows in operation between the emitter and collector. In some embodiments, any component, feature, and/or region that extends elevationally extends vertically or within 10° of vertical.

Further, "directly above", "directly below", and "directly under" require at least some lateral overlap (i.e., horizontally) of two stated regions/materials/components relative one another. Also, use of "above" not preceded by "directly" only requires that some portion of the stated region/material/component that is above the other be elevationally outward of the other (i.e., independent of whether there is any lateral overlap of the two stated regions/materials/components). Analogously, use of "below" and "under" not preceded by "directly" only requires that some portion of the stated region/material/component that is below/under the other be elevationally inward of the other (i.e., independent of whether there is any lateral overlap of the two stated regions/materials/components).

Any of the materials, regions, and structures described herein may be homogenous or non-homogenous, and regardless may be continuous or discontinuous over any material which such overlie. Where one or more example composition(s) is/are provided for any material, that material may comprise, consist essentially of, or consist of such one or more composition(s). Further, unless otherwise stated, each material may be formed using any suitable existing or future-developed technique, with atomic layer deposition, chemical vapor deposition, physical vapor deposition, epitaxial growth, diffusion doping, and ion implanting being examples.

Additionally, "thickness" by itself (no preceding directional adjective) is defined as the mean straight-line distance through a given material or region perpendicularly from a closest surface of an immediately-adjacent material of different composition or of an immediately-adjacent region. Additionally, the various materials or regions described herein may be of substantially constant thickness or of variable thicknesses. If of variable thickness, thickness refers to average thickness unless otherwise indicated, and such material or region will have some minimum thickness and some maximum thickness due to the thickness being variable. As used herein, "different composition" only requires those portions of two stated materials or regions that may be directly against one another to be chemically and/or physically different, for example if such materials or regions are not homogenous. If the two stated materials or regions are not directly against one another, "different composition" only requires that those portions of the two stated materials or regions that are closest to one another be chemically and/or physically different if such materials or regions are not homogenous. In this document, a material, region, or structure is "directly against" another when there is at least some physical touching contact of the stated materials, regions, or structures relative one another. In contrast, "over", "on", "adjacent", "along", and "against" not preceded by "directly" encompass "directly against" as well as construction where intervening material(s), region(s), or structure(s) result(s) in no physical touching contact of the stated materials, regions, or structures relative one another.

Herein, regions-materials-components are "electrically coupled" relative one another if in normal operation electric current is capable of continuously flowing from one to the other and does so predominately by movement of subatomic positive and/or negative charges when such are sufficiently generated. Another electronic component may be between and electrically coupled to the regions-materials-components. In contrast, when regions-materials-components are referred to as being "directly electrically coupled", no intervening electronic component (e.g., no diode, transistor, resistor, transducer, switch, fuse, etc.) is between the directly electrically coupled regions-materials-components.

Any use of "row" and "column" in this document is for convenience in distinguishing one series or orientation of features from another series or orientation of features and along which components have been or may be formed. "Row" and "column" are used synonymously with respect to any series of regions, components, and/or features independent of function. Regardless, the rows may be straight and/or curved and/or parallel and/or not parallel relative one another, as may be the columns. Further, the rows and columns may intersect relative one another at 900 or at one or more other angles (i.e., other than the straight angle).

The composition of any of the conductive/conductor/conducting materials herein may be metal material and/or conductively-doped semiconductive/semiconductor/semiconducting material. "Metal material" is any one or combination of an elemental metal, any mixture or alloy of two or more elemental metals, and any one or more conductive metal compound(s).

Herein, any use of "selective" as to etch, etching, removing, removal, depositing, forming, and/or formation is such an act of one stated material relative to another stated material(s) so acted upon at a rate of at least 2:1 by volume. Further, any use of selectively depositing, selectively growing, or selectively forming is depositing, growing, or forming one material relative to another stated material or materials at a rate of at least 2:1 by volume for at least the first 75 Angstroms of depositing, growing, or forming.

Unless otherwise indicated, use of "or" herein encompasses either and both.

CONCLUSION

In some embodiments, a method used in forming a memory array comprises forming a stack comprising vertically-alternating insulative tiers and conductive tiers. Channel-material strings of memory-cell strings extend through the insulative and conductive tiers. Conductive vias are formed above and individually electrically coupled to individual of the channel-material strings. Insulating material is laterally-between immediately-adjacent of the conductive vias. At least some of the insulating material is vertically removed to form an upwardly-open void-space that is circumferentially about multiple of the conductive vias. Insulative material is formed laterally-between the immediately-adjacent conductive vias to form a covered void-space from the upwardly-open void-space. Digitlines are formed above that are individually electrically coupled to a plurality of individual of the conductive vias there-below.

In some embodiments, a method used in forming a memory array comprises forming a stack comprising vertically-alternating insulative tiers and conductive tiers. Channel-material strings of memory-cell strings extend through the insulative and conductive tiers. Conductive vias are formed above and individually directly electrically coupled to individual of the channel-material strings. Insulating material is laterally-between immediately-adjacent of the conductive vias. At least some of the insulating material is vertically removed to form an upwardly-open void-space that is circumferentially about multiple of the conductive vias. Insulative material is formed all across tops of and laterally-between the immediately-adjacent conductive vias to form a covered void-space from the upwardly-open void-space. Digitlines are formed above and that are individually directly electrically coupled to a plurality of individual of the conductive vias there-below.

In some embodiments, a method used in forming a memory array comprises forming a stack comprising vertically-alternating insulative tiers and conductive tiers. Channel-material strings of memory-cell strings extend through the insulative and conductive tiers. First conductive vias are formed above and individually directly electrically coupled to individual of the channel-material strings. Insulating material is laterally-between immediately-adjacent of the first conductive vias. At least some of the insulating material is vertically removed to form an upwardly-open void-space that is circumferentially about multiple of the first conductive vias. Insulative material is formed all across tops of and laterally-between the immediately-adjacent first conductive vias to form a covered void-space from the upwardly-open void-space. Second conductive vias are formed above and individually directly electrically coupled to individual of the first conductive vias. Digitlines are formed above and that are individually directly electrically coupled to a plurality of individual of the second conductive vias there-below.

In some embodiments, a memory array comprising a stack comprises vertically-alternating insulative tiers and conductive tiers. Channel-material strings of memory-cell strings extend through the insulative and conductive tiers. Digitlines are above and electrically coupled to the channel-material strings by conductive vias that are individually above individual of the channel-material strings and below individual of the digitlines. A covered void-space is circumferentially about multiple of individual of the conductive vias in a horizontal cross-section.

In some embodiments, a memory array comprises a stack comprising vertically-alternating insulative tiers and conductive tiers. Channel-material strings of memory-cell strings extend through the insulative and conductive tiers. First conductive vias are above and individually directly electrically coupled to individual of the channel-material strings. Second conductive vias are above and individually directly electrically coupled to individual of the first conductive vias. Digitlines are above and that are individually directly electrically coupled to a plurality of individual of the second conductive vias there-below. A covered void-space is circumferentially about multiple of the individual first conductive vias in a horizontal cross-section.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A method used in forming a memory array, comprising:
   forming a stack comprising vertically-alternating insulative tiers and conductive tiers, channel-material strings of memory-cell strings extending through the insulative and conductive tiers;
   forming conductive vias above and individually electrically coupled to individual of the channel-material strings, insulating material being laterally-between immediately-adjacent of the conductive vias;
   vertically removing at least some of the insulating material to form an upwardly-open void-space that is circumferentially about multiple of the conductive vias;
   forming insulative material laterally-between the immediately-adjacent conductive vias to form a covered void-space from the upwardly-open void-space, the covered void-space in a vertical cross-section being widest at a top portion thereof than at a bottom portion thereof; and
   forming digitlines above and that are individually electrically coupled to a plurality of individual of the conductive vias there-below.

2. The method of claim 1 wherein the vertical removing comprises etching.

3. The method of claim 1 wherein the vertically removing forms the bottom of the upwardly-open void-space to be at or above the bottoms of the individual conductive vias.

4. The method of claim 3 wherein the vertically removing forms the bottom of the upwardly-open void-space to be above the bottoms of the individual conductive vias.

5. The method of claim 1 wherein the vertical removing leaves some of the insulating material circumferentially about an uppermost portion of lateral sidewalls of the individual conductive vias.

6. The method of claim 5 wherein the vertical removing leaves some of the insulating material circumferentially about all of the lateral sidewalls of the individual conductive vias.

7. The method of claim 1 wherein the forming of the insulative material is also directly above tops of the individual conductive vias.

8. The method of claim 1 wherein the forming of the insulative material is directly against a bottom of the upwardly-open void-space.

9. The method of claim 1 wherein the forming of the insulative material forms the top of the covered void-space above the tops of the individual conductive vias.

10. The method of claim 1 wherein the forming of the insulative material forms the top of the covered void-space below the tops of the individual conductive vias.

11. The method of claim 1 wherein the forming of the insulative material forms the top of the covered void-space to be elevationally-coincident with the tops of the individual conductive vias.

12. A method used in forming a memory array, comprising:
   forming a stack comprising vertically-alternating insulative tiers and conductive tiers, channel-material strings of memory-cell strings extending through the insulative and conductive tiers;
   forming conductive vias above and individually directly electrically coupled to individual of the channel-material strings, insulating material being laterally-between immediately-adjacent of the conductive vias;
   vertically removing at least some of the insulating material to form an upwardly-open void-space that is circumferentially about multiple of the conductive vias;
   forming insulative material all across tops of and laterally-between the immediately-adjacent conductive vias to form a covered void-space from the upwardly-open void-space, the covered void-space in a vertical cross-section being widest at a top portion thereof than at a bottom portion thereof; and
   forming digitlines above and that are individually directly electrically coupled to a plurality of individual of the conductive vias there-below.

13. A method used in forming a memory array, comprising:
   forming a stack comprising vertically-alternating insulative tiers and conductive tiers, channel-material strings of memory-cell strings extending through the insulative and conductive tiers;
   forming first conductive vias above and individually directly electrically coupled to individual of the channel-material strings, insulating material being laterally-between immediately-adjacent of the first conductive vias;
   vertically removing at least some of the insulating material to form an upwardly-open void-space that is circumferentially about multiple of the first conductive vias;
   forming insulative material all across tops of and laterally-between the immediately-adjacent first conductive vias to form a covered void-space from the upwardly-open void-space, the covered void-space in a vertical cross-section being widest at a top portion thereof than at a bottom portion thereof;
   forming second conductive vias above and individually directly electrically coupled to individual of the first conductive vias; and
   forming digitlines above and that are individually directly electrically coupled to a plurality of individual of the second conductive vias there-below.

14. A method used in forming a memory array, comprising:
   forming a stack comprising vertically-alternating insulative tiers and conductive tiers, channel-material strings of memory-cell strings extending through the insulative and conductive tiers;
   forming conductive vias above and individually electrically coupled to individual of the channel-material strings, insulating material being laterally-between immediately-adjacent of the conductive vias;
   vertically removing at least some of the insulating material to form an upwardly-open void-space that is circumferentially about multiple of the conductive vias;
   forming insulative material laterally-between the immediately-adjacent conductive vias to form a covered void-space from the upwardly-open void-space;
   forming digitlines above and that are individually electrically coupled to a plurality of individual of the conductive vias there-below;
   the forming of the insulative material also being directly above tops of the individual conductive vias; and
   wherein portions of conductive material of the individual conductive vias are exposed during the forming of the insulative material and wherein portions of the insulating material are exposed during the forming of the insulating material, the forming of the insulative material comprises depositing the insulative material from the exposed portions of the conductive material of the individual conductive vias selectively relative to the exposed portions of the insulating material.

15. The method of claim 14 wherein the vertical removing leaves some of the insulating material circumferentially about all of lateral sidewalls of the individual conductive vias, the exposed portions of the conductive material of the individual conductive vias comprising the tops of the individual conductive vias, the depositing of the insulative material comprises a selective deposition of the insulative material from the conductive material of the tops of the individual conductive vias.

16. The method of claim 14 comprising treating the exposed portions of the insulating material prior to the selectively depositing of the insulative material to facilitate such selectively depositing.

17. The method of claim 16 wherein the insulative material comprises silicon dioxide.

18. The method of claim 17 wherein the treating comprises exposure to (N,N-dimethyamino)-trimethylsilane (DMATMS) or bis(N,N-dimethylamino)-dimethylsilane (DMADMS), hexamethyl-disilazane (HMDS), 1H,1H,2H,2H-perfluorooctyltrichlorosilane (FOTS or PFOCTS), or heptadecafluoro-1,1,2,2-tetrahydrodecyl) triethoxysilane (HDFTEOS).

19. The method of claim 16 wherein the insulative material comprises spin-on dielectric (SOD) comprising of perhydro-polysilazane.

20. The method of claim 19 wherein the treating comprises exposure to (N,N-dimethyamino)-trimethylsilane (DMATMS) or bis(N,N-dimethylamino)-dimethylsilane (DMADMS), hexamethyl-disilazane (HMDS), 1H,1H,2H,2H-perfluorooctyltrichlorosilane (FOTS or PFOCTS), or heptadecafluoro-1,1,2,2-tetrahydrodecyl) triethoxysilane (HDFTEOS).

21. The method of claim 20 wherein the insulative material comprises $SiO_xN_y$ deposited using $SiH_4$ and one or more of $N_2O$, $CO_2$ and $NH_3$.

22. The method of claim 21 wherein the treating comprises exposure to (N,N-dimethyamino)-trimethylsilane (DMATMS) or bis(N,N-dimethylamino)-dimethylsilane (DMADMS), hexamethyl-disilazane (HMDS), 1H,1H,2H,2H-perfluorooctyltrichlorosilane (FOTS or PFOCTS), or heptadecafluoro-1,1,2,2-tetrahydrodecyl) triethoxysilane (HDFTEOS).

23. The method of claim 16 wherein the insulative material comprises $SI_3N_4$.

24. The method of claim 23 wherein the (N,N-dimethyamino)-trimethylsilane to treating comprises exposure (DMATMS) or bis(N,N-dimethylamino)-dimethylsilane (DMADMS), hexamethyl-disilazane (HMDS), 1H,1H,2H,2H-perfluorooctyltrichlorosilane (FOTS or PFOCTS), or heptadecafluoro-1,1,2,2-tetrahydrodecyl) triethoxysilane (HDFTEOS).

25. The method of claim 16 wherein the insulative material comprises $SI_3N_4$.

26. The method of claim 25 wherein the treating comprises exposure to (N,N-dimethyamino)-trimethylsilane (DMATMS) or bis(N,N-dimethylamino)-dimethylsilane (DMADMS), hexamethyl-disilazane (HMDS), 1H,1H,2H,2H-perfluorooctyltrichlorosilane (FOTS or PFOCTS), or heptadecafluoro-1,1,2,2-tetrahydrodecyl) triethoxysilane (HDFTEOS).

27. A method used in forming a memory array, comprising:
   forming a stack comprising vertically-alternating insulative tiers and conductive tiers, channel-material strings of memory-cell strings extending through the insulative and conductive tiers;
   forming conductive vias above and individually electrically coupled to individual of the channel-material strings, insulating material being laterally-between immediately-adjacent of the conductive vias;
   vertically removing at least some of the insulating material to form an upwardly-open void-space that is circumferentially about multiple of the conductive vias;
   forming insulative material laterally-between the immediately-adjacent conductive vias to form a covered void-space from the upwardly-open void-space; and
   forming parallel digitlines above and that are individually electrically coupled to a plurality of individual of the conductive vias there-below, the insulative material in a vertical cross-section that is parallel the digitlines having laterally-outermost surfaces that are individually curved from top-to-bottom.

28. A method used in forming a memory array, comprising:
   forming a stack comprising vertically-alternating insulative tiers and conductive tiers, channel-material strings of memory-cell strings extending through the insulative and conductive tiers in a memory block;
   forming conductive vias above and individually electrically coupled to individual of the channel-material strings, insulating material being laterally-between immediately-adjacent of the conductive vias;
   vertically removing at least some of the insulating material to form an upwardly-open void-space that is circumferentially about multiple of the conductive vias;
   forming insulative material laterally-between the immediately-adjacent conductive vias to form a covered void-space from the upwardly-open void-space; and
   forming parallel digitlines above and that are individually electrically coupled to a plurality of individual of the conductive vias there-below, the insulative material in a vertical cross-section that is parallel the digitlines having laterally-outermost surfaces that are individually spaced laterally-inward from edges of the memory block.

29. The method of claim 28 wherein the laterally-outermost surfaces are individually curved from top-to-bottom in a vertical cross-section.

* * * * *